(12) United States Patent
Kim et al.

(10) Patent No.: US 7,612,593 B2
(45) Date of Patent: Nov. 3, 2009

(54) DUTY DETECTION CIRCUIT

(75) Inventors: Kyung-Hoon Kim, Kyoungki-do (KR);
Jun-Woo Lee, Kyoungki-do (KR);
Dae-Kun Yoon, Kyoungki-do (KR);
Taek-Sang Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 6 days.

(21) Appl. No.: 12/005,923

(22) Filed: Dec. 28, 2007

(65) Prior Publication Data
US 2009/0058482 A1 Mar. 5, 2009

(30) Foreign Application Priority Data
Nov. 2, 2007 (KR) .................. 10-2007-0111493

(51) Int. Cl.
*H03K 5/02* (2006.01)
(52) U.S. Cl. .......................... 327/175; 327/31
(58) Field of Classification Search ........... None
See application file for complete search history.

(56) References Cited

U.S. PATENT DOCUMENTS

| | | | |
|---|---|---|---|
| 6,198,317 B1* | 3/2001 | Chow et al. | 327/116 |
| 6,639,441 B2* | 10/2003 | Ono et al. | 327/175 |
| 6,967,514 B2* | 11/2005 | Kizer et al. | 327/175 |
| 7,015,739 B2* | 3/2006 | Lee et al. | 327/175 |
| 7,180,346 B2* | 2/2007 | Lee | 327/175 |
| 2004/0189364 A1* | 9/2004 | Lee et al. | 327/175 |
| 2007/0001726 A1* | 1/2007 | Lee | 327/175 |
| 2008/0024182 A1* | 1/2008 | Choi et al. | 327/175 |
| 2008/0204099 A1* | 8/2008 | Hur | 327/175 |
| 2008/0252349 A1* | 10/2008 | Yun et al. | 327/175 |
| 2008/0290920 A1* | 11/2008 | Cheng | 327/175 |
| 2009/0058481 A1* | 3/2009 | Kim et al. | 327/175 |

FOREIGN PATENT DOCUMENTS

| | | |
|---|---|---|
| KR | 1997-0055242 A | 7/1997 |
| KR | 2002-042469 | 2/2002 |
| KR | 10-0510515 | 7/2004 |
| KR | 10-0641703 | 9/2006 |
| KR | 10-0728301 | 6/2007 |

* cited by examiner

*Primary Examiner*—Tuan Lam
*Assistant Examiner*—Hiep Nguyen
(74) *Attorney, Agent, or Firm*—Blakely Sokoloff Taylor & Zafman (57) ABSTRACT

Semiconductor memory device with duty correction circuit includes a clock edge detector configured to generate first and second detection pulses in response to a transition timing of a common clock signal in an initial measurement operation; a duty detector configured to compare the first and second detection pulses to output comparison result signals; and a code counter configured to control the duty detector based on the comparison signals outputted from the duty detector in the initial measurement operation.

25 Claims, 5 Drawing Sheets

DUTY DETECTION CIRCUIT

CROSS-REFERENCE TO RELATED APPLICATIONS

The present invention claims priority of Korean patent application number 10-2007-0111493, filed on Nov. 2, 2007, which is incorporated by reference in its entirety.

BACKGROUND OF THE INVENTION

The present invention relates to a semiconductor memory device, and more particularly, to a semiconductor memory device with a duty correction circuit, which can improve the reliability of the device by controlling the duty ratio of a clock signal used as a reference of operation.

In a system with a variety of semiconductor devices, a semiconductor memory device serves as data storage. The semiconductor memory device outputs data corresponding to addresses received from a data processor, e.g., a central processing unit (CPU), or stores data received from the data processor into unit cells selected by addresses inputted together with the data.

As the operating speed of the system is increasing, the data processor requires the semiconductor memory device to input and output data at higher speed. For the purpose of high-speed data input and output, a synchronous memory device was developed. The synchronous memory device inputs and outputs data in synchronization with a system clock. However, because even the synchronous memory device could not meet the required data input/output speed, a double data rate (DDR) synchronous memory device was developed. The DDR synchronous memory device outputs or inputs data at falling edges and rising edges of the system clock. The DDR synchronous memory device must process two data during one cycle of the system clock so as to input and output data at a falling edge and a rising edge of the system clock. Specifically, the DDR memory device must output data exactly in synchronization with the rising edge and the falling edge of the clock signal. To this end, a data output circuit of the DDR memory device outputs data in synchronization with rising and falling edges of the system clock.

However, the system clock inputted to the semiconductor memory device is inevitably delayed when it arrives at a data output circuit because it passes through a clock input buffer, a clock transmission line, and so on. In addition, the system clock may be distorted by a variety of delay elements within the semiconductor memory device. Thus, if the data output circuit outputs data in synchronization with the delayed system clock, an external device will receive data that are not synchronized with rising edges and falling edges of the system clock.

To solve this problem, the semiconductor memory device uses a delay locked loop (DLL) for locking a delay of the clock signal, and a duty correction circuit for correcting a duty ratio of the clock signal. More specifically, the DLL compensates for a delay caused by internal circuits of the memory device until the system clock as it is inputted to the memory device is accurately transferred to the data output circuit. The duty correction circuit corrects the duty ratio of a clock signal inputted to or outputted from the DLL, or the duty ratio of a clock signal used for transferring data to the inside or outside of the semiconductor memory device. Since a high-speed semiconductor memory device inputs or outputs data or addresses at both the rising edges and the failing edges of the clock signal, a malfunction may occur due to an insufficient clock margin for an entire operation of the semiconductor memory device or the device may not perform required operations within a predefined time when there is a difference between a clock rising timing and a clock falling timing, that is, a high level duration and a low level duration of the clock signal.

In order to correct the duty ratio of the clock signal, the duty correction circuit must measure the duty ratio of the clock signal and adjust the duty ratio by delaying the clock signal. In this case, if there occurs an error in measuring the duty ratio, the duty correction circuit may malfunction to a degree of the error. However, as the semiconductor memory device becomes even more highly integrated and operates at higher speed, the error occurring in measuring the duty ratio is not negligible. Specifically, as the critical dimension (CD) of the semiconductor memory device is scaled down, the error may increase. On the other hand, when the period of the external clock signal decreases, an error ratio may further increase. The error ratio represents an error value with respect to the period of the clock signal. The increase of the error ratio means that the operation margin decreases in the read or write operation making it less likely the correct operation can be achieved within the given time. The increase of the error ratio may degrade the reliability of the semiconductor memory device.

SUMMARY OF THE INVENTION

Embodiments of the present invention are directed to providing a semiconductor memory device with a duty correction circuit, which can perform an initial measurement operation for measuring and removing offsets caused by variation of environment parameters, such as process, voltage level, and temperature within the semiconductor memory device.

In accordance with an aspect of the present invention, the semiconductor memory device includes a clock edge detector configured to generate first and second detection pulses in response to a transition timing of a common clock signal in an initial measurement operation; a duty detector configured to compare the first and second detection pulses to output comparison result signals; and a code counter configured to control the duty detector based on the comparison signals outputted from the duty detector in the initial measurement operation.

DESCRIPTION OF SPECIFIC EMBODIMENTS

Hereinafter, a semiconductor memory device with a duty correction circuit in accordance with the present invention will be described in detail with reference to the accompanying drawings.

In high-speed semiconductor memory devices, data are inputted or outputted in synchronization with rising edges and falling edges of a clock signal. Further, new schemes have been proposed which input or output two data in each of a high level duration and a low level duration of a clock signal. Therefore, a duty correction operation is necessary for accurately measuring a duty ratio of a clock signal and correctly adjusting a ratio of the high level duration and the low level duration. Offsets occur in a clock duty measurement operation and in a duty correction operation according to variation of environment parameters such as process, voltage level, and temperature within the semiconductor memory device. In accordance with specific embodiments of the present invention, accurate duty measurement and correction can be achieved by removing the offsets through an initial measurement operation that is performed before measuring the duty ratio of the clock signal.

Figure 1:
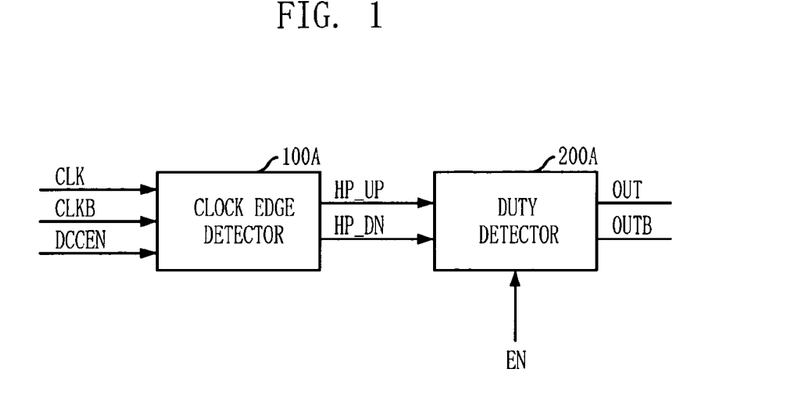
FIG. 1 is a block diagram of a semiconductor memory device in accordance with an embodiment of the present invention.

FIG. 1 is a block diagram of a semiconductor memory device in accordance with an embodiment of the present invention.

Referring to FIG. 1, the semiconductor memory device includes a clock edge detector 100A and a duty detector 200A. The clock edge detector 100A generates detection pulses HP_UP and HP_DN that are representative of an interval between a reference transition timing of a clock signal CLK and a corresponding reference transition timing of a clock bar signal CLKB. The duty detector 200A is enabled by an enable signal EN and compares phases of the detection pulses HP_UP and HP_DN to output comparison signals OUT and OUTB. Although not shown, the comparison signals OUT and OUTB outputted from the duty detector 200A are used as reference when a duty correction circuit corrects the phases of the clock signal CLK and the clock bar signal CLKB.

Figure 2:
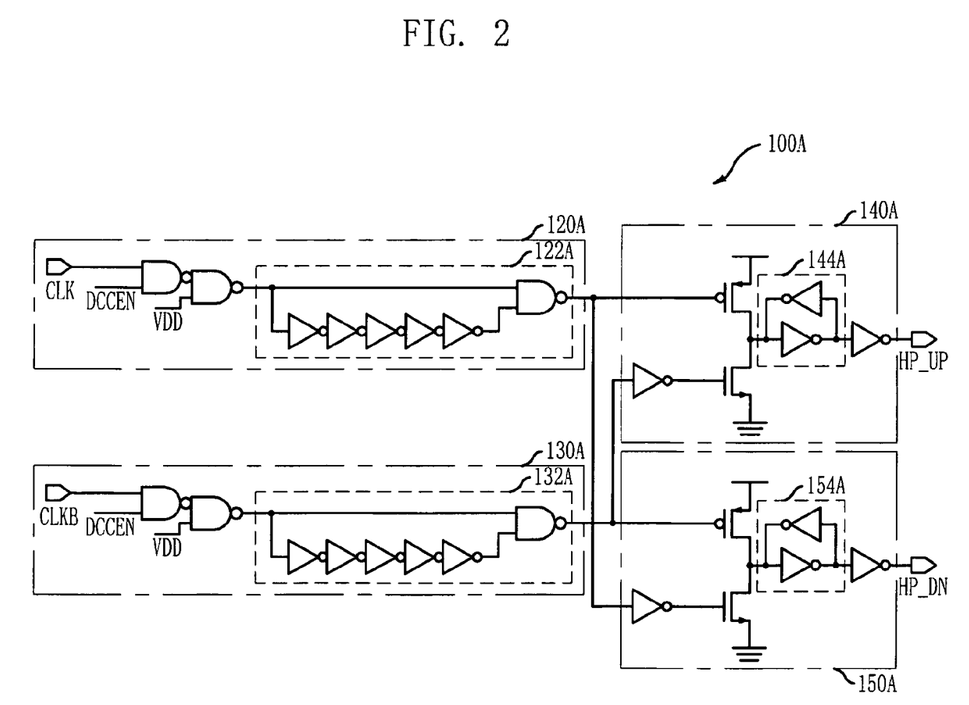
FIG. 2 is a circuit diagram of a clock edge detector of FIG. 1.

FIG. 2 is a circuit diagram of the clock edge detector 100A of FIG. 1.

Referring to FIG. 2, the clock edge detector 100A includes a first edge detecting unit 120A, a second edge detecting unit 130A, a first detection pulse generating unit 140A, and a second detection pulse generating unit 150A.

The first edge detecting unit 120A receives a duty correction enable signal DCCEN and a power voltage signal VDD to generate a first pulse in response to a first transition timing of the clock signal CLK. In the first edge detecting unit 120A, a first logic gate is configured to perform a NAND operation on the clock signal CLK and the duty correction enable signal DCCEN. A second logic gate is configured to perform a NAND operation on an output signal of the first logic gate and the power voltage signal VDD. A first pulse generating unit 122A is configured to generate the first pulse from the clock signal CLK transferred when the duty correction enable signal DCCEN and the power voltage signal VDD are all activated. The first pulse unit 122A may include a plurality of inverters and a NAND gate.

The second edge detecting unit 130A includes logic gates configured to transfer the clock bar signal CLKB in response to the duty correction enable signal DCCEN and the power voltage signal VDD, and a second pulse generating unit 132A. The second edge detecting unit 130A receives the duty correction enable signal DCCEN and the power voltage signal VDD to generate a second pulse in response to a first transition timing of the clock bar signal CLKB.

The first detection pulse generating unit 140A generates the first detection pulse HP_UP that rises to a logic high level in response to the first pulse outputted from the first edge detecting unit 120A, and falls to a logic low level in response to the second pulse outputted from the second edge detecting unit 130A. The first detection pulse generating unit 140A includes a MOS transistor, an inverter latch, and an inverter. The second detection pulse generating unit 150A generates the second detection pulse HP_DN that rises to a logic high level in response to the second pulse and falls to a logic low level in response to the first pulse. The second detection pulse generating unit 150A includes a MOS transistor, an inverter latch, and an inverter.

Figure 3:
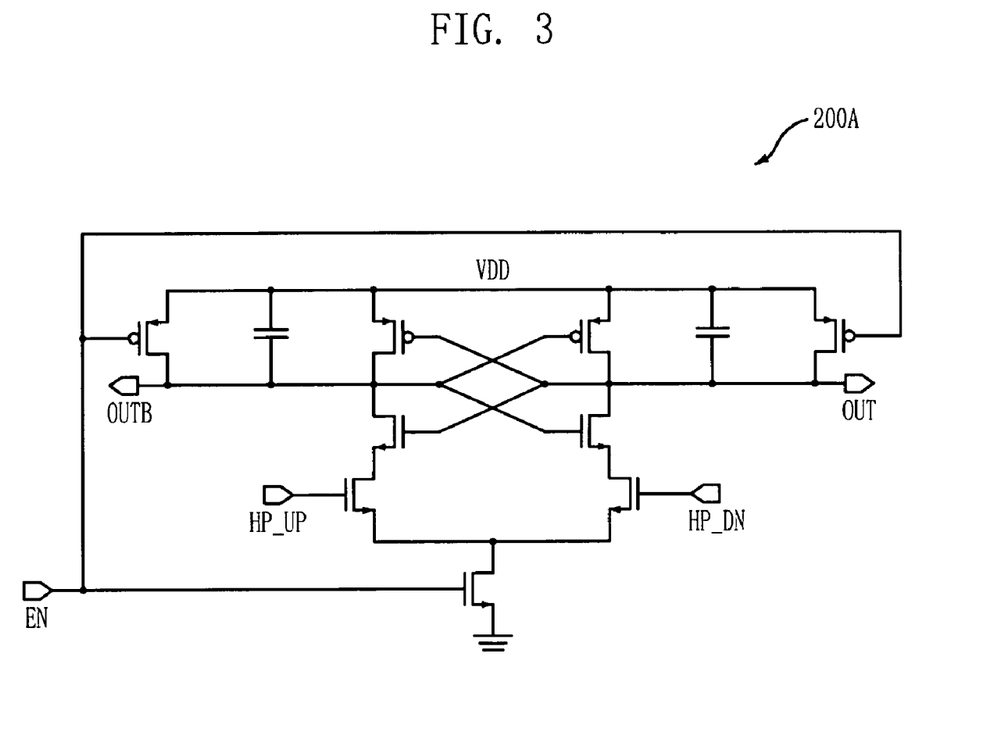
FIG. 3 is a circuit diagram of a duty detector of FIG. 1.

FIG. 3 is a circuit diagram of the duty detector 200A of FIG. 1.

Referring to FIG. 3, the duty detector 200A includes a MOS transistor for forming a current path corresponding to the first and second detection pulses HP_UP and HP_DN, a MOS transistor for enabling the duty detector 200A in response to an enable signal EN, and cross-coupled MOS transistors for outputting comparison result signals according to an amount of current flowing through the current path. That is, the duty detector 200A has a cross-coupled latch structure to compare the inputted signals. The duty detector 200A further includes PMOS transistors and capacitors for resetting the output signal in response to the enable signal EN.

In order to detect the duty ratio of the clock signal CLK and transfer the correct information to the phase correction circuit, the clock edge detector 100A must correctly generate the first and second detection pulses HP_UP and HP_DN under the same environment. That is, when the first and second edge detecting units 120A and 130A output the first and second pulses used as the reference for the generation of the first and second detection pulses HP_UP and HP_DN, the first and second pulses must have the same delay value from the input of the clock signal CLK and the clock bar signal CLKB so as to correctly detect the duty ratio of the clock signal CLK. However, the correct detection of the duty ratio of the clock signal CLK is difficult when the delay values of the clock signal CLK and the clock bar signal CLKB are different due to variation of environment parameters, such as actual structure, process, voltage level, and temperature within the semiconductor memory device. Further, the correct detection of the duty ratio of the clock signal CLK is difficult when delay values are different in the first and second detection pulse generating units 140A and 150A generating the first and second detection pulses HP_UP and HP_DN in response to the first and second pulses. This means that an offset for correct detection exists in the clock edge detector 100A. Like in the clock edge detector 100A, an offset also exists in the duty detector 200A. To remove the offsets, a new circuit is proposed by the present invention, which performs an initial measurement operation for removing the offset.

Figure 4:
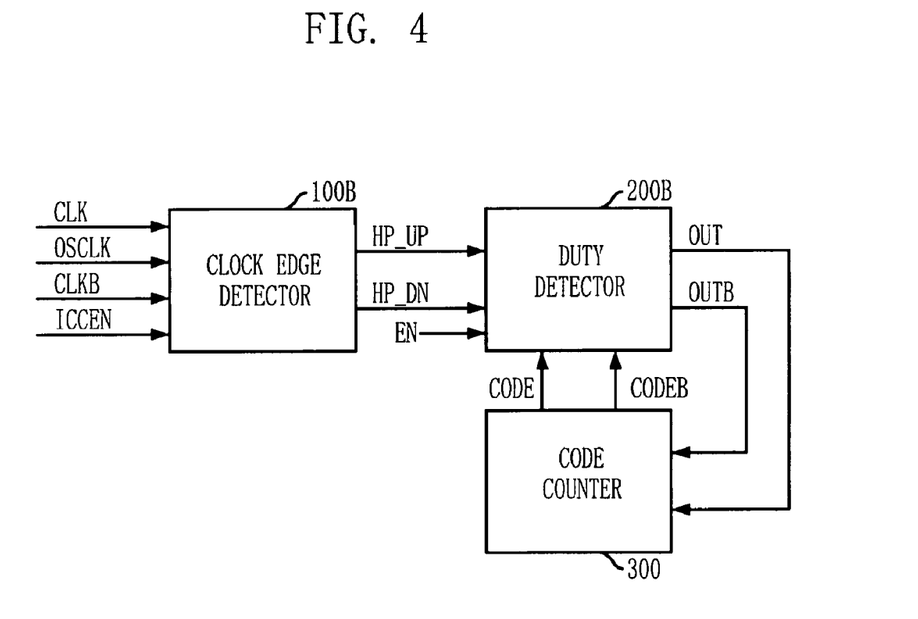
FIG. 4 is a block diagram of a semiconductor memory device in accordance with another embodiment of the present invention.

FIG. 4 is a block diagram of a semiconductor memory device in accordance with another embodiment of the present invention.

Referring to FIG. 4, the semiconductor memory device includes a clock edge detector 100B, a duty detector 200B, and a code counter 300. The clock edge detector 100B generates detection pulses HP_UP and HP_DN representative of an interval between a reference transition timing of a clock signal CLK and a corresponding reference transition timing of a clock bar signal CLKB. The duty detector 200B is enabled by an enable signal EN and compares phases of the detection pulses HP_UP and HP_DN to output comparison signals OUT and OUTB. The code counter 300 performs an initial measurement operation for removing the offsets of the clock edge detector 100B and the duty detector 200B.

The clock edge detector 100B differs from the clock edge detector 100A of FIG. 1 in that it receives a common clock signal OSCLK and an initial measurement enable signal ICCEN. When the initial measurement enable signal ICCEN is activated, the clock edge detector 100B does not measures the interval between the reference transition timing of the clock signal CLK and the reference transition timing of the clock bar signal CLKB, but outputs the detection pulses HP_UP and HP_DN by using the common clock signal OSCLK. That is, the clock edge detector 100B is configured to output the first and second detection pulses HP_UP and HP_DN by using the common clock signal OSCLK. The duty detector 200B compares the first and second detection pulses HP_UP and HP_DN to output the comparison result signals OUT and OUTB to the code counter 300.

The code counter 300 includes a tracking analog-to-digital converter to receive the comparison result signals OUT and OUTB having analog values and output converted digital values as comparison codes CODE and CODEB to the duty detector 200B. The comparison codes CODE and CODEB are binary codes. By another embodiment of the present invention, instead of using the tracking analog-to-digital converter of the code counter 300, the analog values can be used as the comparison result signals OUT and OUTB. In this case, the comparison result signals OUT and OUTB must be carefully processed so as not to be distorted in feeding them back to the duty detector 200B.

In case where the first and second detection pulses HP_UP and HP_DN are inputted to the duty detector 200B in response to the initial measurement enable signal ICCEN, when the duty ratio of the common clock signal OSCLK is 50:50. The first and second detection pulses HP_UP and HP_DN has substantially the same width each other and the duty detector 200B outputs an invalid value. The invalid value is a result such as a bang-bang error that toggles to a logic high level or a logic low level. However, when the duty ratio of the common clock signal OSCLK is not 50:50. The duty detector 200B outputs the valid comparison result signals OUT and OUTB such as a logic high level or a logic low level. This means that the output signal of the clock edge detector 100B may be distorted by environment parameters of the semiconductor memory device. The code counter 300 tracks the comparison result signals OUT and OUTB and feeds back the comparison codes CODE and CODEB to the duty detector 200B. Thus, the duty detector 200B is controlled to output the invalid comparison result according to the environment parameters of the semiconductor memory device. The offsets can be removed by controlling the duty detector 200B through the operation of the code counter 300.

Figure 5:
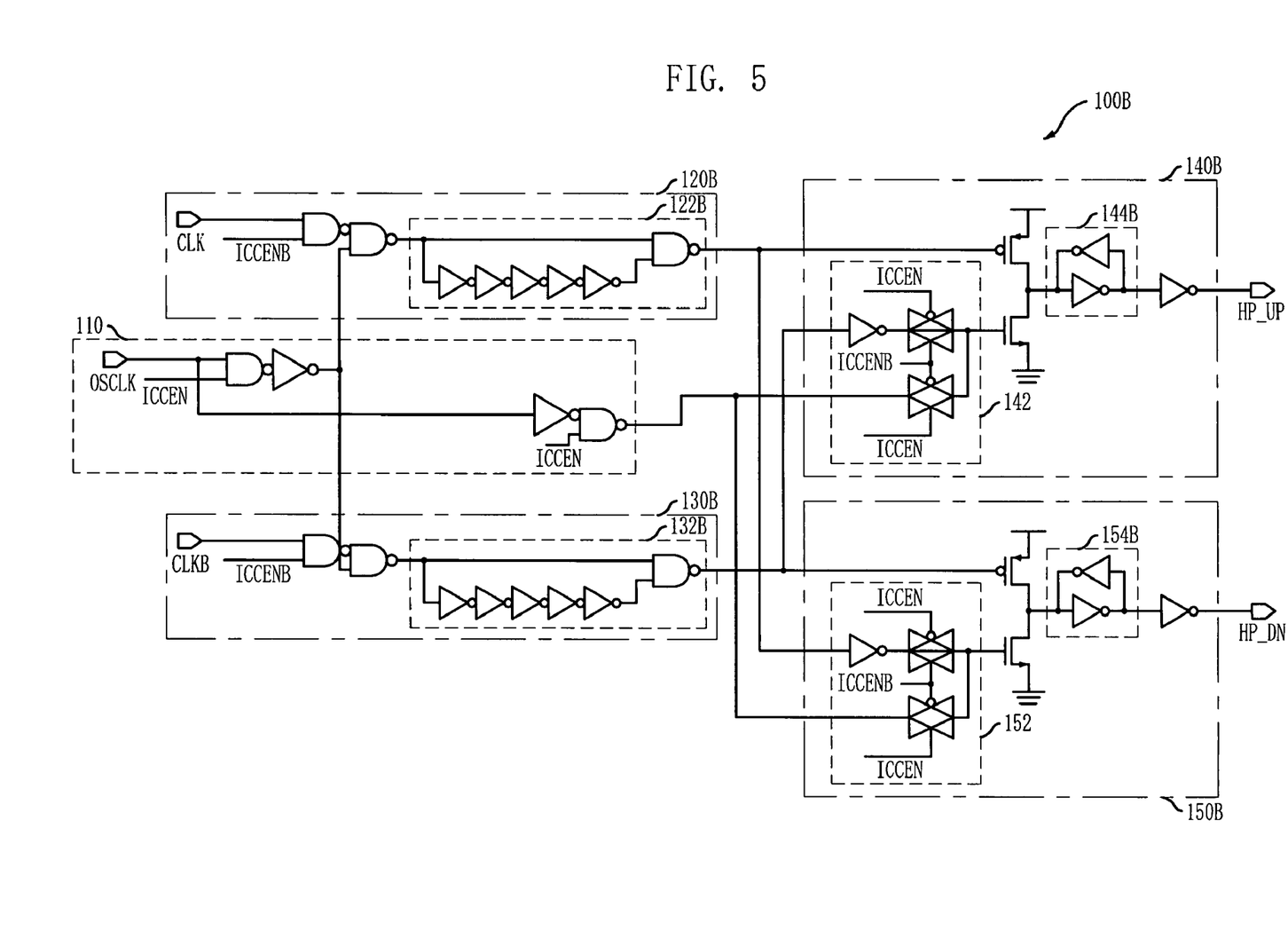
FIG. 5 is a circuit diagram of a clock edge detector of FIG. 4.

FIG. 5 is a circuit diagram of the clock edge detector 100B of FIG. 4.

Referring to FIG. 5, the clock edge detector 100B includes a first edge detecting unit 120B, a second edge detecting unit 130B, a first detection pulse generating unit 140B, a second detection pulse generating unit 150B, and an initial measurement clock transferring unit 110.

The initial measurement clock transferring unit 110 outputs the common clock signal OSCLK to the first detection pulse generating unit 140B and the second detection pulse generating unit 150B when the initial measurement enable signal ICCEN is activated, and enables the first edge detecting unit 120B and the second edge detecting unit 130B when the initial measurement enable signal ICCEN is deactivated. The initial measurement clock transferring unit 110 includes an inverter and a NAND gate.

The first edge detecting unit 120B receives the initial measurement enable signal ICCEN, the initial measurement enable bar signal ICCENB, and the output signal of the initial measurement clock transferring unit 110 to output the first pulse in response to the first transition timing of the clock signal CLK. When the initial measurement enable signal ICCEN is deactivated, the first edge detecting unit 120B outputs the first pulse in response to the clock signal CLK. The first edge detecting unit 120B includes a first NAND logic gate configured to perform a NAND operation with the clock signal CLK and the initial measurement enable bar signal ICCENB, and a second NAND configured to perform a NAND operation with the output signal of the initial measurement clock transferring unit 110 and the output signal of the first NAND logic gate. The first pulse generating unit 122B is configured to generate the first pulse in response to the clock signal CLK when the initial measurement enable signal ICCEN is deactivated. The first pulse generating unit includes a plurality of inverters and a NAND gate.

The second edge detecting unit 130B includes logic gates and a second pulse generating unit 132B for transferring the clock bar signal CLKB in response to the initial measurement enable bar signal ICCENB, and the output signal of the initial measurement clock transferring unit 110. The second edge detecting unit 130B receives the duty correction enable signal ICCENB to output the second pulse in response to the first transition timing of the clock bar signal CLKB.

When the initial measurement enable signal ICCEN is deactivated, the first and second detection pulse generating units 140B and 150B generate the first and second detection pulses HP_UP and HP_DN corresponding to the first and second pulses outputted from the first and second edge detecting units 120B and 130B. On the other hand, when the initial measurement enable signal ICCEN is activated, the first and second detection pulse generating units 140B and 150B generate the first and second detection pulses HP_UP and HP_DN in response to the common clock signal OSCLK transferred from the initial measurement clock transferring unit 110. More specifically, the first detection pulse generating unit 140B includes a signal transferring unit 142, a MOS transistor, and an inverter latch 144B, and the second detection pulse generating unit 150B includes a signal transferring unit 152, a MOS transistor, and an inverter latch 154B. The signal transferring units 142 and 152 transfer the output signal of the initial measurement clock transferring unit 110 to the MOS transistor when the initial measurement enable signal ICCEN is activated, and transfer the output signal of the second detection pulse generating unit 150B to the MOS transistor when the initial measurement enable signal ICCEN is deactivated.

Figure 6:
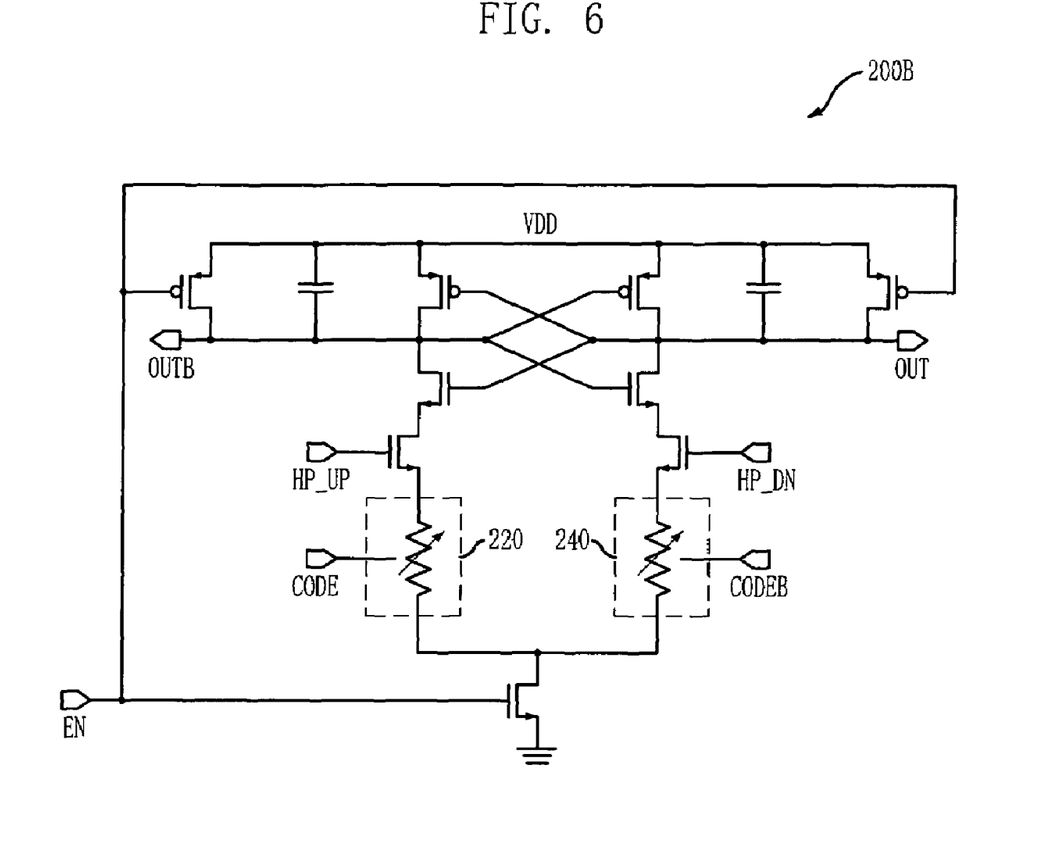
FIG. 6 is a circuit diagram of a duty detector of FIG. 4.

FIG. 6 is a circuit diagram of the duty detector 200B of FIG. 4.

Referring to FIG. 6, the duty detector 200B includes a MOS transistor configured to form a current path corresponding to the first and second detection pulses HP_UP and HP_DN, a MOS transistor for enabling the duty detector 200B in response to the enable signal EN, cross-coupled MOS transistors for outputting a comparison result signals according to an amount of current flowing through the current path, and variable resistors 220 and 240 configured to control the amount of current flowing through the current path by changing their resistances according to the comparison codes CODE and CODEB. That is, the duty detector 200B has a cross-coupled latch type to compare the inputted signals and can remove the offset by adjusting the resistances of the variable resistors 220 and 240 according to the comparison codes CODE and CODEB.

Figure 7:
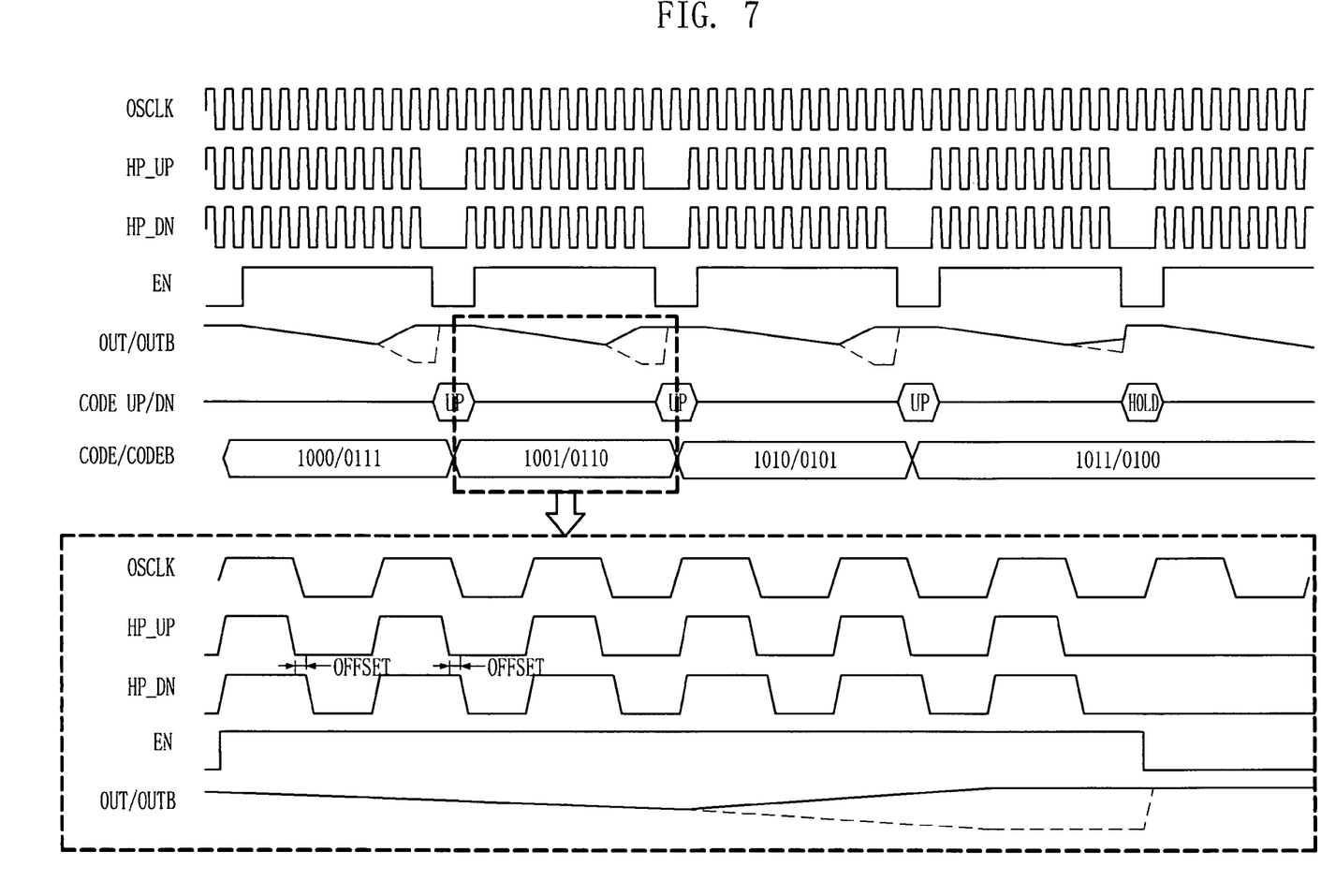
FIG. 7 is a timing diagram illustrating the operation of the semiconductor memory device of FIG. 4.

FIG. 7 is a timing diagram illustrating the operation of the semiconductor memory device of FIG. 4.

Referring to FIG. 7, the semiconductor memory device performs the initial measurement operation for removing the offset. When the enable signal EN is activated in such a state the initial measurement enable signal ICCEN is activated, the duty detector 200B compares the first and second detection pulses HP_UP and HP_DN to output the comparison result signals OUT and OUTB. The code counter 300 converts the comparison result signals OUT and OUTB into the comparison codes CODE and CODEB. The duty detector 200B is controlled by the comparison codes CODE and CODEB. Even though the first and second detection pulses HP_UP and HP_DN are generated and detected by using the common clock signal OSCLK, the offset exists and the measurement of the duty ratio is continuously performed by tracking the offset as illustrated in FIG. 7. The comparison codes CODE and CODEB continuously rises up during the enable signal (EN) period and is held at a timing when the offset is removed. Through these operations, the offsets of the first and second detection pulse generating units 140B and 150B and the duty detector 200B can be removed.

When the method as described above is applied to the first and second edge detecting units 120B and 130B, the offsets occurring in generating the first and second pulses in response to the edges of the clock signal CLK can also be removed.

In the duty measurement circuit demanding precise operations, offsets occurring according to variations of environment parameters, such as actual structure, process, voltage level, and temperature within the semiconductor memory device can be measured and removed, thereby accurately measuring and correcting the duty ratio of the clock signal.

Further, since the duty ratio of the clock can be accurately measured and corrected, high-speed semiconductor memory devices can perform RF operations and ensure an operation margin of internal operations, e.g., a data input/output operation.

Moreover, the offsets can be measured and removed under the general operation environments of the semiconductor memory device, as well as separate test environments for measuring and correcting the duty ratio of the clock signal, especially low frequency clock environments.

While the present invention has been described with respect to the specific embodiments, it will be apparent to those skilled in the art that various changes and modifications may be made without departing from the spirit and scope of the invention as defined in the following claims.

What is claimed is:

1. A duty detection circuit, comprising:
    a clock edge detector configured to generate first and second detection pulses in response to a transition timing of a common clock signal in an initial measurement operation that precedes an associated duty ratio measurement operation for measuring the duty ratio of the common clock signal;
    a duty detector configured to compare the first and second detection pulses to output comparison result signals; and
    a code counter configured to control the duty detector based on the comparison signals outputted from the duty detector in the initial measurement operation.

2. The duty detection circuit as recited in claim 1, wherein the initial measurement operation is performed until the duty detector outputs invalid values as the comparison result signals, the invalid values representing that a phase of at least one of the first and second detection pulses leads or lags behind a phase of the common clock signal.

3. The duty detection circuit as recited in claim 1, wherein the clock edge detector is configured to output the first and second detection pulses in response to transition timings of a first clock signal and a second clock signal when the initial measurement operation is completed.

4. The duty detection circuit as recited in claim 3, wherein the first clock signal has a phase opposite to that of the second clock signal.

5. The duty detection circuit as recited in claim 4, wherein the clock edge detector comprises:
    a first edge detecting unit configured to output a first pulse in response to a first transition timing of the first clock signal;
    a second edge detecting unit configured to output a second pulse in response to a first transition timing of the second clock signal;
    an initial measurement clock transferring unit configured to output the common clock signal and disable the first and second edge detecting units in the initial measurement operation;
    a first detection pulse generating unit configured to generate the first detection pulse in response to an output signal of the initial measurement clock transferring unit in the initial measurement operation and generate the first detection pulse in response to the first and second pulses when the initial measurement operation is completed; and
    a second detection pulse generating unit configured to generate the second detection pulse in response to an output signal of the initial measurement clock transferring unit in the initial measurement operation and generate the second detection pulse in response to the first and second pulses when the initial measurement operation is completed.

6. The duty detection circuit as recited in claim 5, wherein the first edge detecting unit comprises:
    a logic circuit configured to transfer the clock signal in response to an initial measurement enable signal, which is activated in the initial measurement operation, and the output signal of the initial measurement clock transferring unit; and
    a first pulse generating unit configured to generate the first pulse in response to a first transition timing of an output signal of the logic circuit.

7. The duty detection circuit as recited in claim 5, wherein the second edge detecting unit comprises:
    a logic circuit configured to transfer the clock bar signal in response to an initial measurement enable signal, which is activated in the initial measurement operation, and the output signal of the initial measurement clock transferring unit; and
    a second pulse generating unit configured to generate the second pulse in response to a first transition timing of an output signal of the logic circuit.

8. The duty detection circuit as recited in claim 5, wherein the initial measurement clock transferring unit comprises:
    a first logic circuit configured to disable the first and second edge detecting units in the initial measurement operation and enable the first and second edge detecting units when the initial measurement operation is completed; and
    a second logic circuit configured to transfer the common clock signal to the first and second detection pulse generating units.

9. The duty detection circuit as recited in claim 5, wherein the first detection pulse generating unit comprises:
    a first MOS transistor configured to transfer a power voltage signal in response to an output signal of the first edge detecting unit;
    a transferring unit configured to transfer the output signal of the initial measurement clock transferring unit in the initial measurement operation and transfer an inverted signal of the second pulse when the initial measurement operation is completed;

a second MOS transistor configured to transfer a ground voltage signal in response to an output signal of the first transferring unit; and a latch configured to transfer output signals of the first and second MOS transistors.

10. The duty detection circuit as recited in claim 5, wherein the second detection pulse generating unit comprises:

a first MOS transistor configured to transfer a power voltage signal in response to an output signal of the second edge detecting unit;

a transferring unit configured to transfer the output signal of the initial measurement clock transferring unit in the initial measurement operation and transfer an inverted signal of the first pulse when the initial measurement operation is completed;

a second MOS transistor configured to transfer a ground voltage signal in response to an output signal of the second transferring unit; and a latch configured to transfer output signals of the first and second MOS transistors.

11. The duty detection circuit as recited in claim 5, wherein the first and second edge detecting units are configured to receive the common clock signal from the initial measurement clock transferring unit to output the first and second pulses, respectively.

12. The duty detection circuit as recited in claim 2, wherein the code counter comprises a tracking analog-to-digital converter configured to track the comparison result signals outputted from the duty detector and convert the comparison result signals into digital comparison codes.

13. The duty detection circuit as recited in claim 12, wherein the code counter is configured to increase or decrease the comparison codes according to the comparison result signals outputted from the duty detector, and hold the comparison codes when the comparison result signals have a invalid value.

14. The duty detection circuit as recited in claim 2, wherein the code counter comprises a tracking analog-to-digital converter configured to track the comparison result signals outputted from the duty detector and convert the comparison result signals into code signals having corresponding analog voltage levels.

15. The duty detection circuit as recited in claim 2, wherein the duty detector comprises a variable resistor having a resistance varying according to an output signal of the code counter, so that a current flowing through the duty detector is controlled by the resistance of the variable resistor.

16. A duty detection circuit, comprising:

a clock edge detector configured to generate first and second detection pulses corresponding to a high level duration and a low level duration of a common clock signal in response to an initial measurement enable signal;

a duty detector configured to compare the first and second detection pulses in response to comparison codes to output comparison result signals; and a code counter configured to output the comparison codes by tracking the comparison result signals outputted from the duty detector until the first and second detection pulses have the same phase.

17. The duty detection circuit as recited in claim 16, wherein the clock edge detector is configured to output the first and second detection pulses in response to a transition timing of a clock signal and a transition timing of a clock bar signal.

18. The duty detection circuit as recited in claim 17, wherein the clock edge detector comprises:

a first edge detecting unit configured to output a first pulse in response to a first transition timing of the clock signal;

a second edge detecting unit configured to output a second pulse in response to a first transition timing of the clock bar signal;

an initial measurement clock transferring unit configured to output the common clock signal and disable the first and second edge detecting units in the initial measurement operation;

a first detection pulse generating unit configured to generate the first detection pulse in response to an output signal of the initial measurement clock transferring unit in the initial measurement operation and generate the first detection pulse in response to the first and second pulses when the initial measurement operation is completed; and a second detection pulse generating unit configured to generate the second detection pulse in response to an output signal of the initial measurement clock transferring unit in the initial measurement operation and generate the second detection pulse in response to the first and second pulses when the initial measurement operation is completed.

19. The duty detection circuit as recited in claim 18, wherein the first and second edge detectors are configured to receive the common clock signal from the initial measurement clock transferring unit to output the first and second pulses, respectively.

20. The duty detection circuit as recited in claim 16, wherein the code counter comprises a tracking analog-to-digital converter configured to track the comparison result signals outputted from the duty detector and convert the comparison result signals into digital comparison codes.

21. The duty detection circuit as recited in claim 16, wherein the duty detector comprises a variable resistor having a resistance varying according to an output signal of the code counter, so that a current flowing through the duty detector is controlled by the resistance of the variable resistor.

22. A method for operating a duty detection circuit in a semiconductor memory device, the method comprising:

generating first and second detection pulses in response to a transition timing of a common clock signal in an initial measurement operation that precedes an associated, duty ratio measurement operation that measures the duty ratio of the common clock signal;

comparing the first and second detection pulses in response to comparison codes to output comparison result signals; and tracking the comparison result signals in the initial measurement operation and adjusting the comparison codes to output the comparison results when the first and second detection pulses have the same phase.

23. The method as recited in claim 22, further comprising outputting the detection pulses in response to a transition timing of a clock signal and a transition timing of a clock bar signal when the initial measurement operation is completed.

24. The method as recited in claim 22, wherein the generating of the first and second detection pulses comprises:

outputting a first pulse in response to a first transition timing of a clock signal;

outputting a second pulse in response to a first transition timing of a clock bar signal;

outputting the common clock signal and disabling the first and second pulses in the initial measurement operation;

generating the first detection pulse in response to the common clock signal in the initial measurement operation and generating the first detection pulse in response to the first and second pulses when the initial measurement operation is completed; and generating the second detection pulse in response to the common clock signal in the initial measurement operation and generating the second detection pulse in response to the first and second pulses when the initial measurement operation is completed.

25. The method as recited in claim 22, wherein the adjusting of the comparison codes comprises:

tracking the comparison result signals and converting the comparison result signals into the comparison codes having digital values; and outputting the comparison result signals when the first and second detection pulses have the same phase by adjusting a current flowing inside the semiconductor memory device through variation of resistance corresponding to the comparison codes.

* * * * *